United States Patent
Rueb et al.

(10) Patent No.: US 8,183,660 B2
(45) Date of Patent: May 22, 2012

(54) SEMICONDUCTOR COMPONENT HAVING RECTIFYING JUNCTIONS OF DIFFERENT MAGNITUDES AND METHOD FOR PRODUCING THE SAME

(75) Inventors: Michael Rueb, Faak am See (AT); Roland Rupp, Lauf (DE); Michael Treu, Villach (AT)

(73) Assignee: Infineon Technologies AG, Neubiberg (DE)

( * ) Notice: Subject to any disclaimer, the term of this patent is extended or adjusted under 35 U.S.C. 154(b) by 620 days.

(21) Appl. No.: 12/037,269

(22) Filed: Feb. 26, 2008

(65) Prior Publication Data

US 2008/0203517 A1 Aug. 28, 2008

(30) Foreign Application Priority Data

Feb. 26, 2007 (DE) .................. 10 2007 009 227

(51) Int. Cl.
  *H01L 21/329* (2006.01)
  *H01L 29/872* (2006.01)
(52) U.S. Cl. ............. 257/478; 257/486; 257/E21.359; 257/E27.271; 438/534; 438/571; 438/576
(58) Field of Classification Search ............ 257/478, 257/486; 438/534, 571, 576
See application file for complete search history.

(56) References Cited

U.S. PATENT DOCUMENTS

| 4,982,260 | A | * | 1/1991 | Chang et al. ........... 257/656 |
|---|---|---|---|---|
| 5,262,668 | A | | 11/1993 | Tu et al. |
| 6,078,090 | A | * | 6/2000 | Williams et al. ........ 257/476 |
| 6,362,495 | B1 | | 3/2002 | Schoen et al. |
| 6,501,146 | B1 | * | 12/2002 | Harada ................... 257/475 |
| 6,562,706 | B1 | | 5/2003 | Liu et al. |
| 6,710,418 | B1 | * | 3/2004 | Sapp ....................... 257/471 |
| 6,861,723 | B2 | | 3/2005 | Willmeroth |
| 6,905,916 | B2 | | 6/2005 | Bartsch et al. |
| 7,728,402 | B2 | * | 6/2010 | Zhang et al. .......... 257/471 |
| 7,791,138 | B2 | * | 9/2010 | Pfirsch .................... 257/337 |
| 2004/0046224 | A1 | | 3/2004 | Rossel et al. |
| 2005/0199918 | A1 | * | 9/2005 | Calafut et al. ........ 257/260 |

FOREIGN PATENT DOCUMENTS

| DE | 199 54 866 A1 | 5/2001 |
|---|---|---|
| DE | 102 59 373 A1 | 7/2004 |
| DE | 10 2004 054 352 B3 | 2/2006 |
| WO | WO-2006/061277 A1 | 6/2006 |

OTHER PUBLICATIONS

Lisa M. Porter et al.; "A critical review of ohmic and rectifying contacts for silicon carbide"; Materials Science & Engineering B34 (1995), pp. 83-105.
Jon Mark Hancock; "Novel SiC Diode Solves PFC Challenges"; Power Electronics Technology, Jun. 2006, pp. 28-30, 32-35.

* cited by examiner

*Primary Examiner* — Anh Mai
(74) *Attorney, Agent, or Firm* — Dickstein Shapiro LLP

(57) ABSTRACT

A semiconductor component is proposed which has a semiconductor body having a first semiconductor zone of the first conduction type, at least one first rectifying junction with respect to the first semiconductor zone, at least one second rectifying junction with respect to the first semiconductor zone, wherein the three rectifying junctions each have a barrier height of different magnitude.

21 Claims, 9 Drawing Sheets

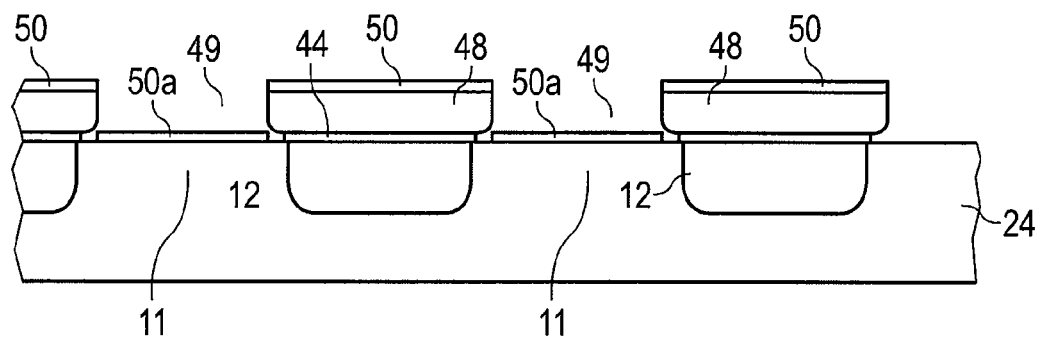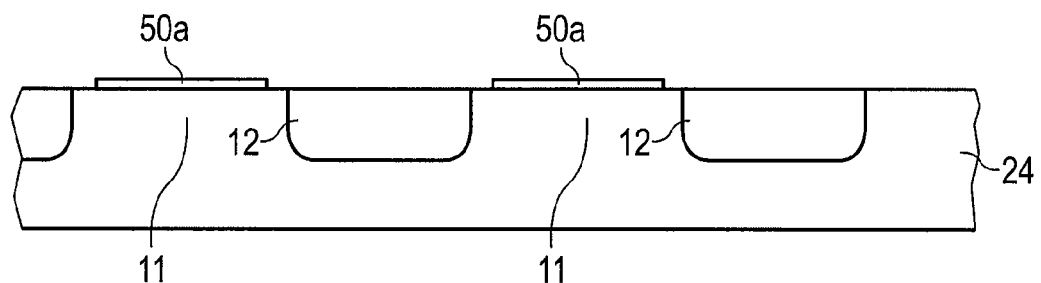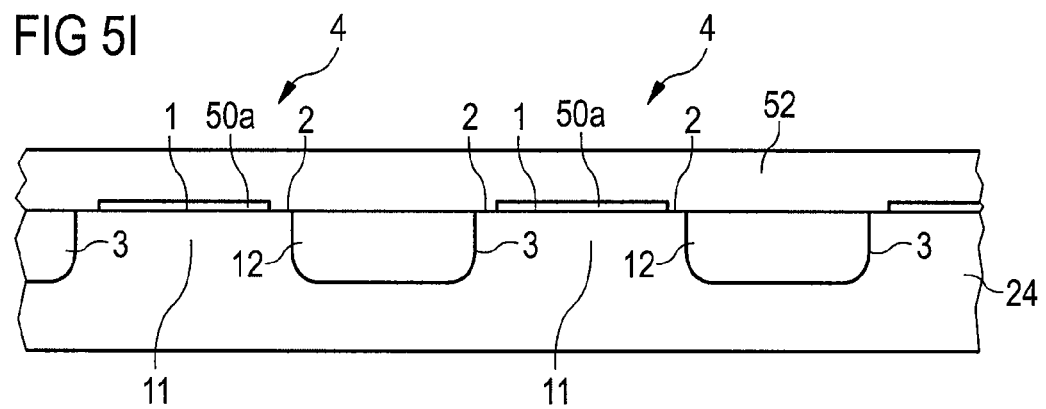

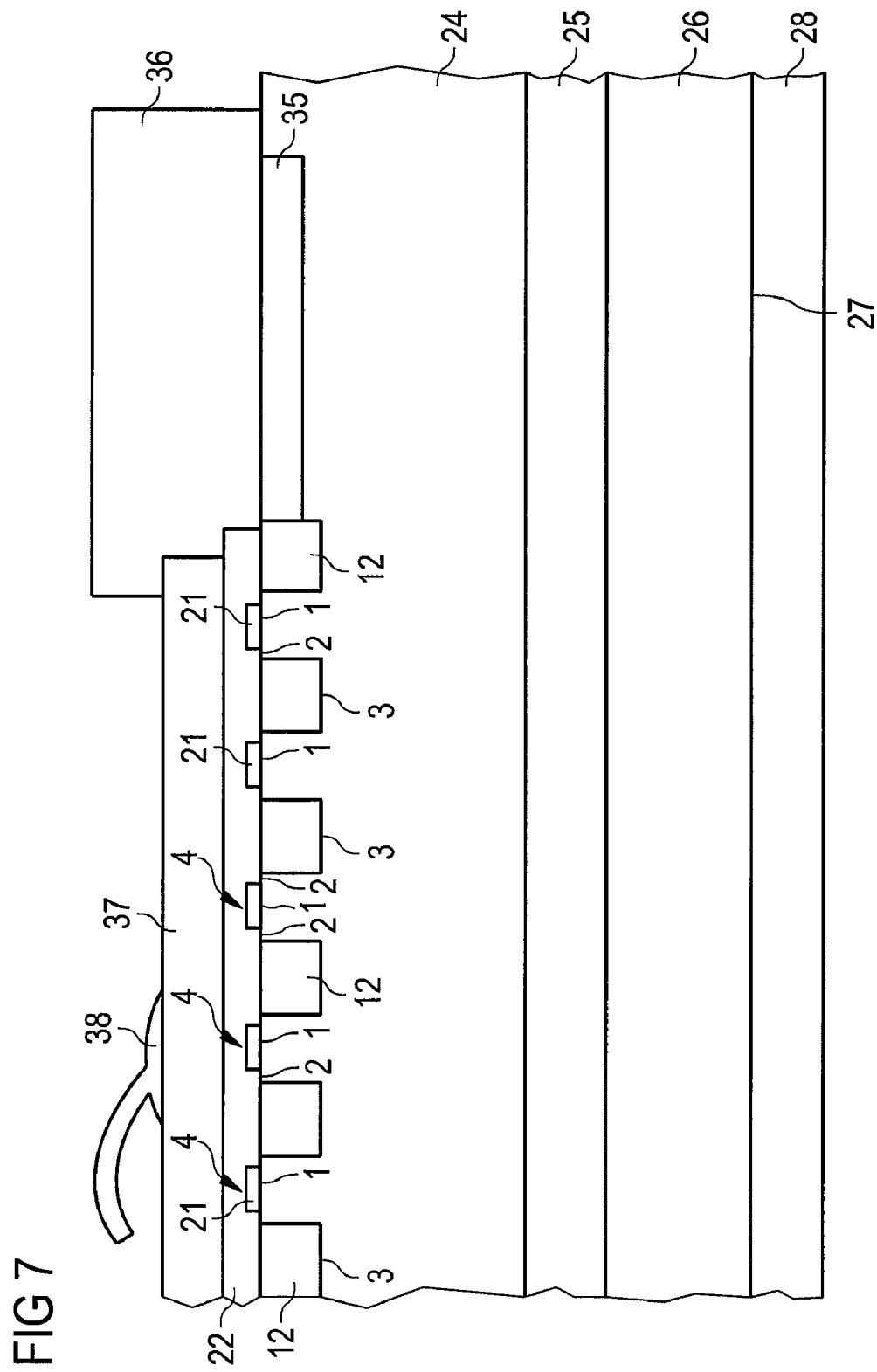

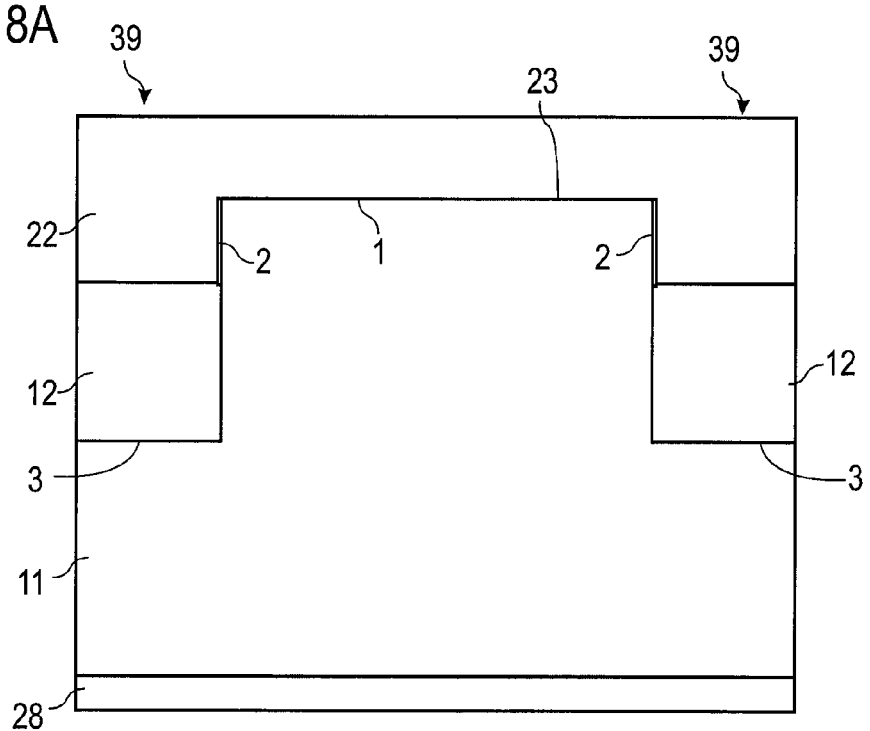
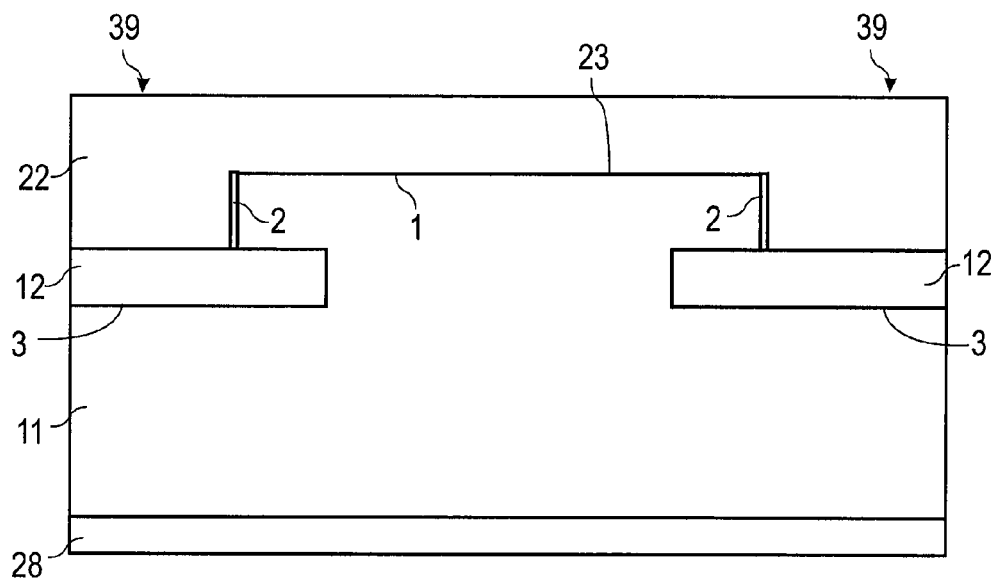

SEMICONDUCTOR COMPONENT HAVING RECTIFYING JUNCTIONS OF DIFFERENT MAGNITUDES AND METHOD FOR PRODUCING THE SAME

CROSS-REFERENCE TO RELATED APPLICATION

This application claims priority to German Patent Application Serial No. DE 10 2007 009 227.1, which was filed Feb. 26, 2007, and is incorporated herein by reference in its entirety.

FIELD OF THE INVENTION

The present description includes embodiments pertaining to semiconductor components having rectifying junctions and, particularly, to diodes having pn and Schottky junctions.

BACKGROUND

Rectifying junctions transmit the current in one direction, but block it in the other direction. Examples of rectifying junctions are pn junctions and Schottky junctions. Schottky diodes, in particular, are used for high-frequency applications. Moreover, Schottky diodes are also used as power semiconductor rectifiers.

Schottky diodes can be formed as vertical or lateral components. In power semiconductor application, vertical components having large-area Schottky contacts are predominant. The current flows perpendicular to the lateral extent of the semiconductor component and typically from a first surface to an opposite second surface of the semiconductor substrate.

SUMMARY

One embodiment provides a semiconductor component, wherein the semiconductor component has a semiconductor body having a first semiconductor zone of the first conduction type; at least one first rectifying junction with respect to the first semiconductor zone; at least one second rectifying junction with respect to the first semiconductor zone; and at least one third rectifying junction with respect to the first semiconductor zone; wherein the three rectifying junctions each have a barrier height of different magnitude.

Properties of the semiconductor component can be set in a targeted manner by means of the at least three rectifying junctions having barrier heights of different magnitude in each case. Thus, by way of example, the temperature behavior of the semiconductor component can be controlled in a targeted manner. In addition, it is possible to set the blocking properties largely independently of the conducting-state properties. In particular, by a suitable choice of the barrier heights, the reverse current can be reduced without simultaneously increasing the threshold voltage. In addition, it is possible to arrange the rectifying junctions in such a way that rectifying junctions having a low barrier height are arranged in the region of low electric field strengths and rectifying junctions having high barrier heights are arranged in the region of high electric field strengths. As a result, the influence of the different field strengths on the reverse current can be largely compensated for by using different rectifying junctions.

BRIEF DESCRIPTION OF THE FIGURES

Embodiments are described below which are shown in the appended figures and from which further advantages and modifications become apparent. However, the invention is not restricted to the concretely described embodiments, but rather can be modified and altered in a suitable manner. It lies within the scope of the invention to combine individual features and feature combinations of one embodiment with features and feature combinations of another embodiment in a suitable manner in order to arrive at further embodiments.

FIGS. 5A to 5I show individual method steps for producing a semiconductor component having three rectifying junctions having barrier heights of different magnitude in each case.

FIG. 7 shows a partial excerpt from a diode for power applications, said diode having pn junctions and Schottky diodes arranged between the pn junctions.

FIGS. 8A and 8B show a diode according to a further embodiment.

DETAILED DESCRIPTION

Some embodiments will be explained below. In this case, identical structural features in the figures are identified by identical reference symbols.

In the context of the present description, a rectifying junction is understood to be a junction having a pronounced diode characteristic. Rectifying junctions accordingly have a reverse direction and a forward direction opposite thereto, wherein the respective direction relates to the polarity of an electric field applied via the rectifying junction. Examples of rectifying junctions are pn junctions and Schottky junctions.

In the context of the present description, a Schottky diode is to be understood to be an arrangement having at least two regions having Schottky barriers of different height (barrier height). These regions are also referred to as Schottky contact. Accordingly, a Schottky diode has at least two Schottky contacts having barrier heights of different magnitude. In this case, a Schottky contact is the contact region between a contact material suitable for forming a Schottky junction and a semiconductor material. The Schottky contact has a predetermined, substantially constant barrier height in said contact region.

The term "lateral" relates to the lateral extension of a semiconductor material or a semiconductor base material. These are typically present as thin wafers or chips. By contrast, the term "vertical" relates to the direction which is perpendicular to the lateral extension and which runs in the thickness direction of the wafer or chip.

The dopings used in the embodiments are merely by way of example and can also be doped correspondingly complementarily.

Figure 1:
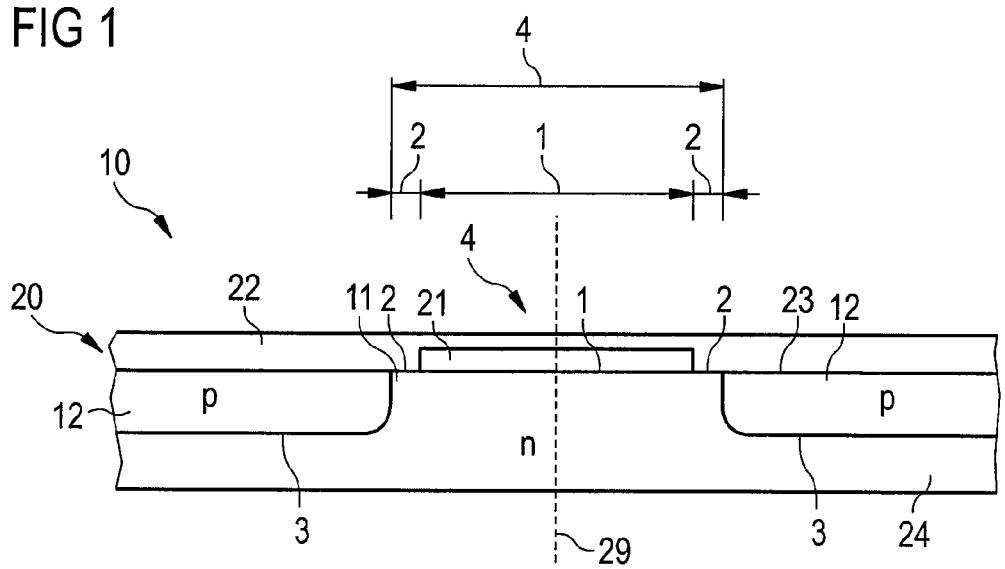
FIG. 1 shows, using the example of a vertical diode, a semiconductor component having three rectifying junctions having barrier heights of different magnitude in each case, wherein the different rectifying junctions are realized by at least one pn junction and two different Schottky contacts.

In order to reduce the threshold voltage in semiconductor components having rectifying junctions, and in particular in diodes having a Schottky contact, the semiconductor component 10 shown in FIG. 1 in accordance with a first embodiment has a Schottky diode 4 having at least two Schottky contacts 1 and 2 having barrier heights of different magnitude in each case. The Schottky contacts 1 and 2 are formed between a layer 20 arranged on a first surface 23 of a semiconductor substrate 24 and a first semiconductor zone 11 of the first conduction type, said first semiconductor zone being arranged in the semiconductor substrate 24. Furthermore, two second semiconductor zones 12 of the second conduction type, which is complementary to the first conduction type, are arranged in the semiconductor substrate 24, said second semiconductor zones being spaced apart laterally with respect to one another and laterally delimiting the Schottky diode 4. The second semiconductor zones 12 spaced apart laterally with respect to one another are embedded into the semiconductor substrate 24 and form with the semiconductor substrate 24, which here simultaneously represents the first semiconductor zone 11, a respective pn junction 3. In the present embodiment, the semiconductor substrate 24 is n-doped, and the second semiconductor zones 12 are p-doped. The semiconductor substrate 24 can be a layer produced epitaxially.

In the present embodiment, the Schottky diode 4 has a first Schottky contact 1 and two second Schottky contacts 2. The first Schottky contact 1 is in each case spaced apart laterally from the second semiconductor zones 12 and thus from the pn junctions 3. In this case, the first Schottky contact 1 is arranged in particular in such a way that it is at a lateral distance of identical magnitude from the two second semiconductor zones 12. A respective second Schottky contact 2 is arranged between the first Schottky contact 1 and a respective second semiconductor zone 12. The second Schottky contacts 2 each have a lateral extent corresponding approximately to the lateral distance between the first Schottky contact 1 and the second semiconductor zones 12 or the pn junctions 3. The second semiconductor zones 12, the first Schottky contact 1 and also the two second Schottky contacts 2 are arranged in particular mirror-symmetrically with respect to a plane 29 of symmetry running perpendicular to the first surface 23 and running centrally through the first Schottky contact 1.

The lateral extent of Schottky diode 4 and of first and second Schottky contacts is indicated by arrows in FIG. 1.

In the present embodiment, the first Schottky contact forms the first rectifying junction. By contrast, a respective second Schottky contact 2 forms a second rectifying junction. The pn junctions 3 form respective third rectifying junctions. The barrier height of the individual rectifying junctions can be set by suitable choice of material, by way of example. Since the three different rectifying junctions 1, 2 and 3 each form a junction with respect to the semiconductor substrate 24 or with respect to the first semiconductor zone 11, the barrier height is determined by the type of material which forms the respective junction through contact with the first semiconductor zone 11. In the case of the third rectifying junctions 3 (pn junctions), the barrier height of the pn junction is typically determined by the band gap of the semiconductor material used. The same semiconductor material is typically used for the first and second semiconductor zones 11, 12 and the semiconductor substrate 24. The semiconductor material can be silicon carbide (SiC), for example. By contrast, the barrier height of the first and second rectifying junctions 1 and 2, which are formed here by the first Schottky contact 1 and second Schottky contact 2, is determined by the difference between the work functions of the contact material respectively used and of the semiconductor material used for the first semiconductor zone 11. In this case, the barrier height of the Schottky contacts 1 and 2 with respect to the first semiconductor zone 11 in first semiconductor zone 11 is generally always lower than the barrier height of the pn junction 3.

In order to form the first and second Schottky contacts 1 and 2, it is possible to use different materials, for example, which are in direct contact with the first surface 23 of the semiconductor substrate 24 and in particular in contact with an uncovered surface of the first semiconductor zone 11. In this case, the materials are selected such that the first Schottky contact 1 has a higher barrier height than the second Schottky contacts 2. In principle, all materials suitable for forming a Schottky junction can be used for forming the respective Schottky contacts 1 and 2. By way of example, a multiplicity of metals are suitable for forming Schottky junctions, the metals then coming into direct contact with the semiconductor zone 11. In this case, metal-semiconductor junctions are then present. By way of example, the first Schottky contact 1 is formed by using a first metal (metal 1) as contact material, while the second Schottky contact is formed by using a second metal (metal 2) as contact material.

Schottky junctions of the metal-semiconductor type can also be formed by using very highly doped semiconductor material as contact material, the contact material then being composed of the same semiconductor base material as the first semiconductor zone 11. A homogeneous semiconductor junction is present in this case, where "homogeneous" junction relates to the semiconductor base material. Such a junction does not represent a pn junction, however, since the very highly doped semiconductor material has virtually metallic properties. Such metallically conducting semiconductor zones generally have an extremely high defect concentration of greater than or equal to $1*10^{20}$ per cm³. By contrast, semiconductor zones which form true pn junctions have a defect concentration of less than about $1*10^{20}$ per cm³.

If the first Schottky contact 1 is formed between the layer 21 shown for example in FIG. 1 and the first semiconductor zone 11, then the layer 21, for the case where a semiconductor material of the same basic type as for the first semiconductor zone 11 is involved, has a significantly higher defect concentration than the first semiconductor zone 11 and second semiconductor zone 12.

A behavior comparable to Schottky contacts can however also be achieved by so-called heterojunctions, that is to say junctions between semiconductor materials of different basic types. In this case, the layer 21 is then composed of a different semiconductor material than the semiconductor substrate 24 or the first semiconductor zone 11. Such a heterojunction can be produced by epitaxial deposition of the different semiconductor material onto the uncovered surface of the first semiconductor zone 11. If the layer 21 is monocrystalline (for example in the case of epitaxial deposition), this is also referred to as a true heterojunction. By contrast, false heterojunctions are formed between a monocrystalline semiconductor material, for example the first semiconductor zone 11, and a different polycrystalline semiconductor material (for example layer 21 if it was not deposited epitaxially). If the semiconductor substrate 24 or the first semiconductor zone 11 is composed of SiC, for example, both n- and p-doped polysilicon, for example, can be used for false heterojunctions.

However, the barrier height of a Schottky junction or Schottky contact depends not only on the difference in work functions between semiconductor material and the contact material used for forming a Schottky junction, but also on the quality of the interface between the two materials. In this case, interface states can shift the barrier height considerably in some instances. It is also possible, therefore, to produce Schottky contacts having barrier heights of different magnitude by targeted modification of the surface of the semiconductor material. It is then even possible to use the same material for both Schottky contacts. Only the surface in the region of the different Schottky contacts to be formed is modified differently in each case.

One possibility for modifying the surface of the semiconductor substrate or of the first semiconductor zone in a suitable manner consists in superficially oxidizing the surface of the first semiconductor zone in the region of at least one of the two Schottky contacts and then removing this oxide layer again wet-chemically before the contact material is deposited. Another possibility of surface modification is a selective plasma treatment of the surface region to be modified.

Another option for providing Schottky contacts with different barrier height is the use of anisotropic semiconductor material having polar axes, which forms Schottky contacts of different barrier height at different crystallographic faces. SiC and GaAs are examples of such materials. The anisotropic semiconductor material can be, for example, suitably structured to expose faces of different crystallographic orientation. For example, the side walls of a trench can be of another crystallographic orientation than the bottom wall of the trench or the main surface. When depositing a single Schottky barrier forming material on both the sidewalls of the trench and the main surface, Schottky contacts with different barrier heights are formed. If desired, the surface can be selectively modified prior to deposition. It would also be possible, to deposit different materials on the sidewalls and the main surface.

By using two Schottky contacts having barrier heights of different magnitude in each case, it is possible to lower the threshold voltage of the Schottky diode without this leading to an increase in the reverse current. Without wishing to be limited, the physical background can be understood here as follows.

Both the threshold voltage in the forward direction and the magnitude of the reverse current in the reverse direction are dependent on the barrier height of the Schottky contact. In order to keep the threshold voltage as low as possible, a barrier height that is as low as possible is desired. However, a low barrier height simultaneously leads to a smaller blocking effect, such that the reverse current thereby increases since the reverse current rises exponentially as the barrier height decreases. Furthermore, the reverse current of a Schottky diode is exponentially dependent on the electric field strength in the region of the Schottky contacts. The electric field strength in said region is typically not homogeneous in particular in the edge regions thereof. As a result, said region can be divided into partial regions having field strengths of different magnitude. If a Schottky contact having a comparatively high barrier height is then formed in a partial region of high electric field strengths, in said partial region the reverse current is reduced in comparison with the case where the Schottky contact has a low barrier height there, since the high barrier height leads to a reduction of the reverse current there. In the partial regions in which the electric field strength is not as high, by contrast, a Schottky contact having a lower barrier height, by contrast, will be formed. Consequently, in regions of high field strengths in which the reverse current is typically highest, the reverse current is reduced by the comparatively high barrier height. The reverse current therefore has a more homogeneous distribution as seen spatially and a lower intensity in absolute terms. The reverse current can therefore be reduced overall.

In the forward direction, the Schottky contact having the high barrier height leads to a high threshold voltage, however. This is compensated for, however, by the Schottky contact having a lower barrier height. The Schottky contact or contacts having the low barrier height has/have only a low threshold voltage, such that in the forward direction said contacts already contribute to the current flow even at low forward voltages. The current flow then takes place at low voltages in the forward direction firstly via the contacts having the low barrier height and, as the forward voltage increases, also commences in the contacts having a high barrier height. Overall, it is thereby possible to reduce the threshold voltage and thus to minimize the power loss.

Consequently, the Schottky diode is formed in such a way that, relative to the spatial profile of the electric field strength in the blocking case, Schottky contacts (first rectifying junction) having a high barrier height are arranged in the region of high electric field strengths and Schottky contacts (second rectifying junction) having a lower barrier height with respect thereto are arranged in the region of low electric field strengths. In order to distinguish between high and low electric field strengths, it is possible to define a threshold value corresponding for example to a predetermined percentage of the maximum electric field strength present at the Schottky diode.

Figure 3:
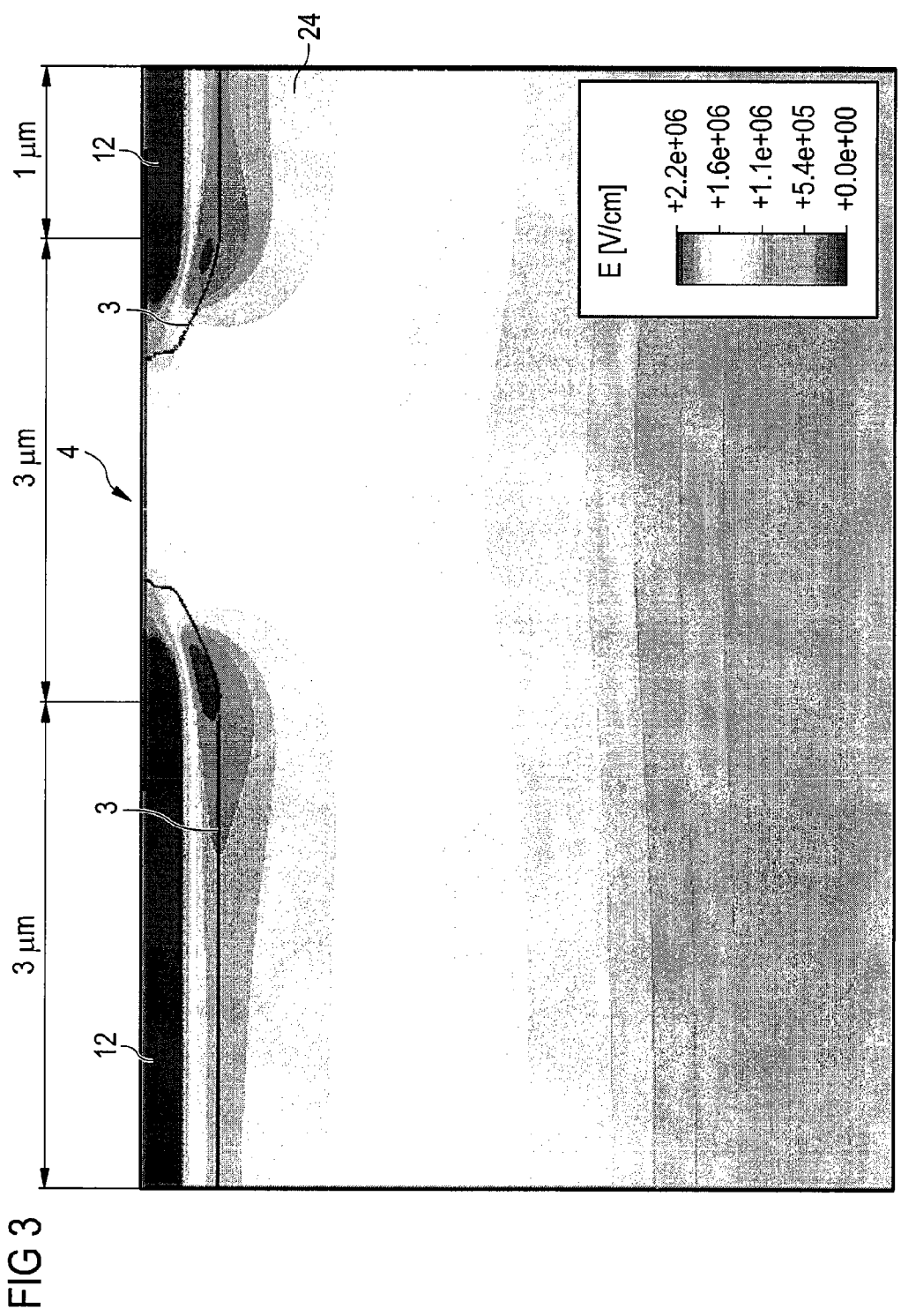
FIG. 3 shows the electric field distribution in the blocking case of the semiconductor component shown in FIG. 1.
Figure 4:
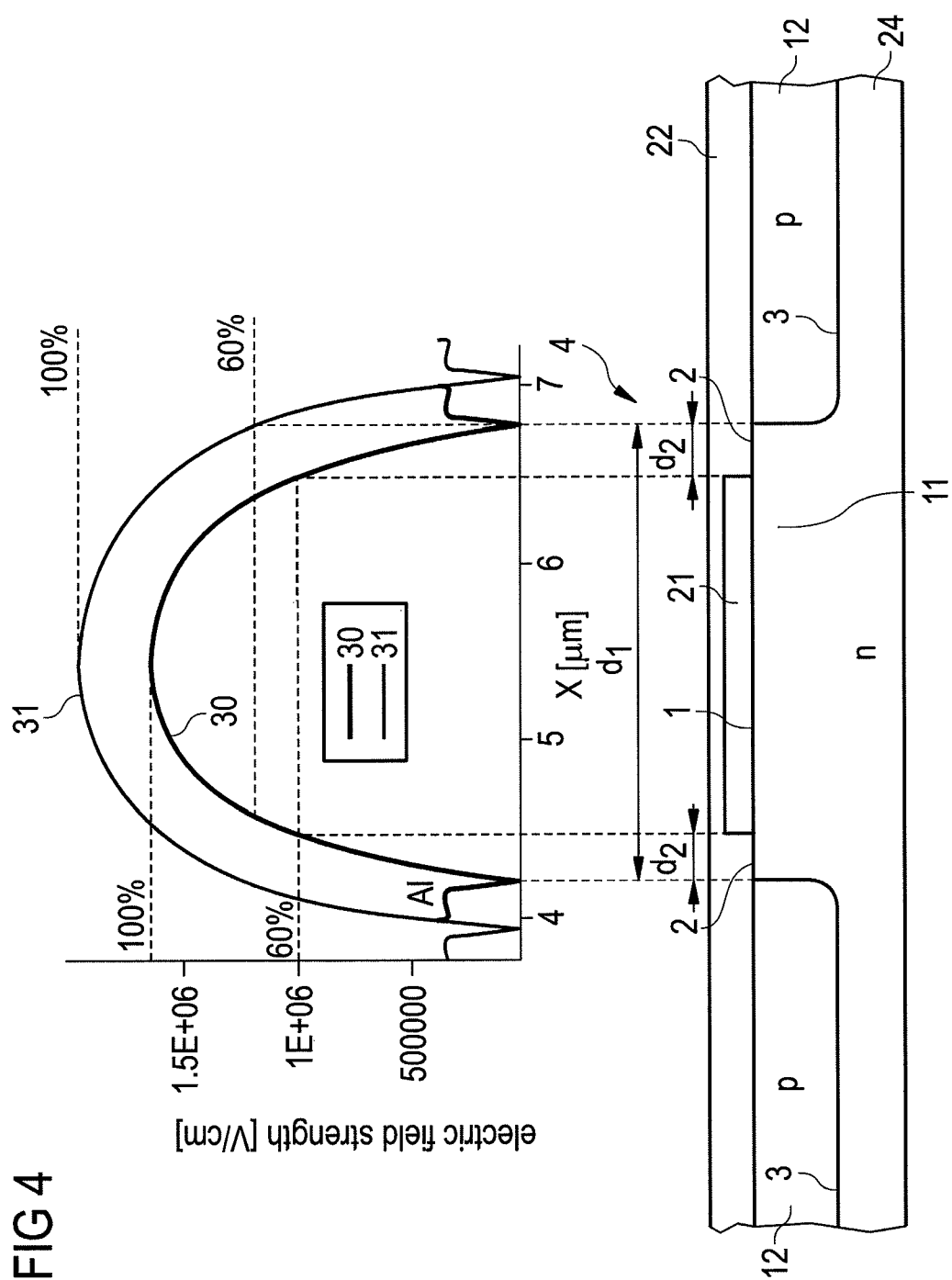
FIG. 4 shows the electric field profile at the semiconductor surface of the structure shown in FIG. 1 and also Schottky contacts having barrier heights of different magnitude that are arranged in accordance with the field profile.

To better illustrate the profile of the field strength and the spatial arrangement of the individual Schottky contacts, reference is made to FIGS. 3 and 4. FIG. 3 shows the electric field strength distribution in the semiconductor substrate 24 in the blocking case. The Schottky diode 4 delimited by two pn junctions 3 is shown in the central region. An exemplary extent of the pn junctions and of the second semiconductor zones 12 is specified in FIG. 3. In this case, the second semiconductor zone on the left in FIG. 3 has the function of a triggering island, while the second semiconductor zone 12 shown in FIG. 3 performs the function of a shield.

FIG. 4 illustrates the structure—shown in FIG. 1—of a mixed diode having a Schottky diode and a pn junction and also the profile of the electric field strength in the blocking case at the surface 23 of the first semiconductor zone along a connecting line that connects the two second semiconductor zones 12 to one another. As can be discerned, the electric field strength at the surface of the first semiconductor zone 11 rises greatly proceeding from mutually opposite edge regions of the second semiconductor zones 12. After just a comparatively short distance from the edge region of the second semiconductor zones 12, the electric field strength reaches more than 60% of the maximum electric field strength present in the central region of the Schottky diode 4. The particular structure of this field strength profile is brought about by the second semiconductor zones 12, which displace the electric field from the edge regions of the Schottky diode.

The first Schottky contact 1 having a high barrier height is formed, then, in such a way that it is arranged in regions in which the electric field strength is higher than a preselected threshold value, for example at least 60% of the maximum field strength. In the present region, this is the central region of the Schottky diode 4. On account of the exponential dependence of the reverse current on the electric field strength, the Schottky contact 1 is arranged for example in such a way that it is at the same distance in each case from the respectively opposite edges of the second semiconductor zones 12. Said distance is designated by d2 in FIG. 4. The lateral extent of the Schottky diode 4 between the two second semiconductor zones 12 is designated by d1, by contrast. In the present case, the lateral extent d1 of the Schottky diode 4 also corresponds to the lateral distance between adjacent second semiconductor zones 12, where their distance relates to mutually opposite outer edges of adjacent second semiconductor zones 12. The second Schottky contact 2 having a lower barrier height by comparison with the first Schottky contact 1 is formed, by contrast, in the intermediate region between first Schottky contact 1 and the second semiconductor zones 12.

In FIG. 4, the field strength profile that typically occurs is illustrated by curve 30 and the field strength profile shortly before breakdown (worst case) is illustrated by curve 31. The relation—indicated by way of example in FIG. 4—between the extent of the second Schottky contacts 2 or the distance d2 from the first Schottky contact 1 to the second semiconductor zones 12 and the relative electric field strength can be modified in a suitable manner depending on the application. In particular, it is possible to provide further Schottky contacts. Thus, by way of example, a third Schottky contact can be provided symmetrically with respect to the second semiconductor zones 12 in the central region of the Schottky diode 4, wherein the third Schottky contact then has an even higher barrier height in comparison with the first Schottky contact 1. The third Schottky contact can then be arranged for example in the regions in which the electric field strength in the blocking case is at least 80% of the maximum field strength. The first Schottky contact would then take up the ranges above 60% of the maximum field strength to approximately 80% of the maximum field strength. It is also possible to use more than three Schottky contacts having different barrier heights. As a result, the different Schottky contacts of the Schottky diode can be adapted in smaller steps and thus even better to the profile of the electric field strength.

As can be discerned from the abscissa in FIG. 4, the Schottky diode 4 has a lateral extent of approximately 2-3 µm, for example. The second semiconductor zones 12 likewise have an extent of a few µm. If this structure is taken as basis and SiC is used as semiconductor base material for the semiconductor substrate 24 and the first and second semiconductor zones 11 and 12, then it is suitable for example to use titanium having a barrier height of approximately 1.3 eV as metal 1 for forming the first Schottky contact and aluminum having a barrier height of approximately 1 eV as metal 2 for forming the second Schottky contacts 2. When using these materials and the resultant barrier heights, the second Schottky contacts 2 should have a lateral extent d2 such that the maximum electric field at the second Schottky contacts is approximately 60% of the maximum field strength of the Schottky diode 4 given a barrier height of 1.3 eV. In this case, the reverse current through the first Schottky contact 1 is of approximately just the same magnitude as the reverse current flowing through the second Schottky contacts 2. This means in concrete terms for this embodiment that the contact width of the aluminum on the first semiconductor zone 11, which is an n-conducting zone here, is approximately 0.3 µm. Approximately 20% of the contact area of the Schottky diode 4 is therefore provided with aluminum. The first Schottky contact 1 therefore has a larger contact area with respect to the first semiconductor zone 11 in comparison with the second Schottky contacts.

In the forward flow direction, under normal operating conditions, the threshold voltage of metal 1, that is to say of titanium in the present case, is not exceeded. In this case, the first Schottky contact 1 is also blocked in the forward flow direction, that is to say in the forward direction. However, by increasing the voltage in the forward direction, the first Schottky contact 1 can also contribute to the electric current flow. Furthermore, at high current densities it can happen that the threshold voltage difference between the two metals falls over half the width of metal 1 and, consequently, metal 1 also contributes to the current flow. The current density required for this below metal 1 is for example approximately 5000 A/cm$^2$ for the 600 volts voltage class with a typical doping of $1.17*10^{16}$ per cm$^3$. Since, in power semiconductors, a plurality of Schottky diodes in the form of cells are generally connected in parallel, the required current density converted to the total chip area, depending on the cell geometry, is significantly lower, by contrast.

If only one common contact material is chosen instead of different contact materials for forming the at least two Schottky contacts and the different barrier heights are set by selective surface modification of the semiconductor substrate, the individual regions can be spatially divided in the manner as when different contact materials are used.

In certain embodiments, the three rectifying junctions, that is to say the two Schottky contacts 1 and 2 and the pn junction 3, are connected in parallel with one another, for example. This can be achieved for example by the materials used for forming the first and second Schottky contacts 1 and 2 being electrically conductively connected to the second semiconductor zone 12 or the second semiconductor zones 12. If for example different metals (metal 1 for the first Schottky contact; metal 2 for the second Schottky contact) are used for forming the first and second Schottky contacts 1 and 2, metal 2, for example, is in direct contact with the second semiconductor zone 12, on the one hand, and with metal 1, on the other hand.

The rectifying junctions are typically arranged adjacent to one another. In this case, the first rectifying junction 1 directly adjoins the second rectifying junction 2 and the third rectifying junction 3 directly adjoins the second rectifying junction 2. However, the first rectifying junction 1 is spaced apart from the third rectifying junction 3, wherein the second rectifying junction 2 is arranged between the other two rectifying junctions. Consequently, the second rectifying junction 2 is laterally delimited by the other two rectifying junctions.

By way of example, the semiconductor component has at least two second rectifying junctions arranged respectively on opposite sides of the first rectifying junction. Furthermore, the semiconductor component has for example at least two third rectifying junctions between which the first and the two second rectifying junctions are arranged, wherein the second rectifying junctions are arranged between the third and first rectifying junctions and in each case adjoin them. This arrangement is configured symmetrically in particular. Such a semiconductor component is shown in FIG. 4, for example.

In some of the embodiments described herein a suitable geometrical arrangement of the rectifying junctions is provided, that is to say in particular of first and second rectifying junctions (first and second Schottky contacts), with respect to the electric field strength profile, wherein the first rectifying junction can be arranged in the region of high electric field strengths and the second rectifying junction can be arranged in the region of low electric field strengths.

Figure 2:
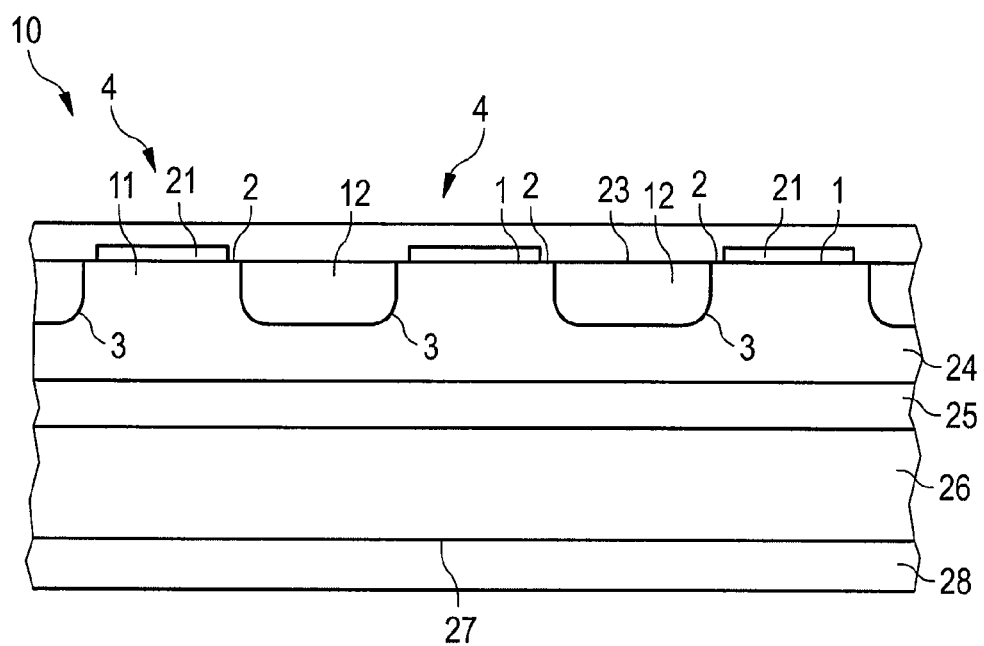
FIG. 2 shows a semiconductor component having a multiplicity of rectifying junctions, wherein a respective Schottky diode having at least two Schottky contacts is arranged between adjacent pn junctions.

A multiplicity of regularly arranged Schottky diodes is typically used in power semiconductors. A respective pn junction is then situated between adjacent Schottky diodes. A portion of such a power semiconductor component is illustrated in FIG. 2. The Schottky diodes 4 have a respective first Schottky contact 1 in their central region and a respective second Schottky contact 2 in the edge region with respect to adjacent pn junctions 3. The formation of the first and second Schottky junctions 1 and 2 approximately corresponds to the spatial arrangement shown in FIG. 1. In this case, the spatial arrangement is shown on the basis of a vertical section through the relevant semiconductor component. In power semiconductors, the individual Schottky diodes 4 in each case form an individual cell. In this case, in a plan view of the first surface 23 of the semiconductor substrate 24, such a cell can be circular or hexagonal, for example. In such arrangements, therefore, it is also possible for the central region of the Schottky diode 4 to be formed by the first Schottky contact 1, which is surrounded completely in circular fashion by the second Schottky contact 2.

In order to form the first Schottky contact, for example a first metal 1 (layer 21) is applied to the first surface 23 of the semiconductor substrate 24 for example in self-aligned fashion with respect to the edges of the second semiconductor zones 12. Afterward, a metal 2 (layer 22) is deposited over the whole area, said metal forming the second Schottky contacts 2 in edge regions between the metal 1 and the second semiconductor zones 12. At the same time the metal 2 represents the electrically conductive connection between the metal 1 and the second semiconductor zones 12.

The semiconductor substrate 24 typically has an epitaxially produced layer that simultaneously forms the first semiconductor zone 11. The semiconductor substrate 24 furthermore has a semiconductor base substrate 26 and can furthermore have a field stopper layer 25 arranged between the semiconductor base substrate 26 and the epitaxial layer 11. A large-area rear side metallization 28 for making contact with the semiconductor substrate 24 on the rear side is arranged on a second surface 27 of the semiconductor substrate 24, said second surface being arranged opposite the first surface 23. Such a structure is shown in FIG. 2.

As mentioned above, in certain embodiments, layers 21, 22 forming the respective Schottky contacts are electrically conductively connected to the second semiconductor zone. Furthermore, the Schottky contacts 1, 2 of the Schottky diode 4 can have differently sized contact areas with respect to the first semiconductor zone 11 in certain embodiments. In some embodiments, at least two second semiconductor zones 12 are provided which are spaced apart from one another and which each form a respective pn junction 3 with respect to the first semiconductor zone 11. In this case, the Schottky diode 4 can be arranged between the second semiconductor zones 12. Furthermore the semiconductor body may have a first surface 23, as far as which the first semiconductor zone 11 extends and at which the Schottky diode 4 is arranged. As it becomes apparent from the description above, according to some embodiments, a diode is provided, which have at least one pn junction, and at least two Schottky contacts 1, 2 having barrier heights of different magnitude. The two Schottky contacts 1, 2 form a Schottky diode which typically adjoins the pn junction. In many embodiments, the second Schottky contact 2 is arranged between first Schottky contact 1 and the pn junction 3.

FIG. 7 shows a merged pn Schottky power diode having a multiplicity of individual Schottky diodes 4 between which pn junctions 3 are respectively arranged. The complete structure of the power diode can be attained by mirroring of the structure illustrated in FIG. 7 at the left-hand vertical edge. In addition FIG. 7 also shows an edge termination 35 and an edge isolation 36. A contact layer 37 suitable for bonding can also be situated on the metal 2 (layer 22) likewise used here, a bonding contact 38 being applied to said contact layer.

In addition to the reduction of the threshold voltage without a simultaneous appreciable rise in the reverse current, as mentioned above, the combination of three rectifying junctions has the further advantage that the temperature dependence of the semiconductor component can be reduced. At high current densities, Schottky diodes generally have a positive temperature coefficient, that is to say that as the temperature rises, the resistance of the diode increases. By contrast, pn junctions have a negative temperature dependence, that is to say that their resistance decreases as the temperature increases. A balanced temperature behavior can be achieved by combination and integration of these components.

With reference to FIGS. 8A and 8B, further embodiments will be described. Different to the embodiments of Schottky contacts formed on the planar first surface 23 as described above, at least one of the Schottky contacts is formed in a trench structure.

The embodiments of FIGS. 8A and 8B show diodes having pn junctions 3 formed at the bottom regions of trenches 39 formed in the first semiconductor zone 11. The trenches 39 are partially filled with semiconductor material 12 of opposite conduction type to the first semiconductor zone 11. This semiconductor material forms in the present embodiments the second semiconductor zone 12. The upper portion of the trenches 39 is filled with a Schottky contact forming material 22, particularly a metal, which also covers the first surface 23. Alternatively, the trenches can also only extend down to the lower level of the Schottky contact forming material 22. In this case, the second semiconductor region 12 is formed by implantation.

Common to both embodiments of FIGS. 8A and 8B is the use of an anisotropic semiconductor material for the first semiconductor zone 11. Anisotropic semiconductor materials form Schottky contacts of different magnitude at different crystallographic faces. For example, the side walls of the trenches 39 are of different crystallographic orientation than laterally extending faces such as the first surface 23. When a Schottky forming material is deposited on such faces different Schottky contacts are formed. Denoted by 2 are Schottky contacts of lower magnitude formed on the side walls of the trenches in comparison to Schottky contacts, denoted by 1, formed on the first surface 23. Hence, when using anisotropic semiconductor material, such as SiC and GaAs, Schottky contacts of different barrier height can be formed by suitably structuring the semiconductor material.

In the embodiment shown in FIG. 8B, the second semiconductor regions 12 laterally partially extend into the mesa region formed between adjacent trenches to improve the characteristics of the diode.

The Schottky barrier forming material forming the two different Schottky contacts 1 and 2 is typically in direct contact with the second semiconductor zone 12 defining the pn junction 3. Alternatively, two separate Schottky barrier forming materials can also be used to form the different Schottky contacts. For example, the trench or trenches 39 can be filled with a first metal to flush with the first surface 23 on which a second metal is subsequently deposited.

Figure 5A:
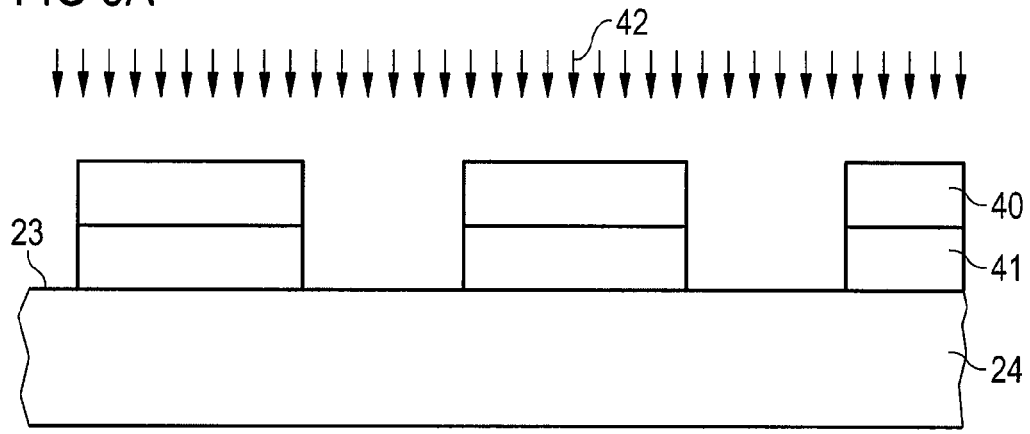

The production of the semiconductor component will be explained below with reference to FIGS. 5A to 5I. Firstly, a semiconductor substrate 24 is provided. This can be an n-doped layer 24 deposited epitaxially onto a semiconductor base substrate 26 (shown in FIG. 2). The semiconductor substrate 24 subsequently forms the first semiconductor zone 11. A mask layer composed of, for example, an oxide (e.g. silicon oxide) is then deposited onto a first surface 23 of the semiconductor substrate 24 and is suitably patterned with the aid of a photomask 40. In this case, by way of example, an RIE (reactive ion etching) dry etching step 42 can be used. The mask 41, in the present case a hard mask composed of silicon oxide, produced from the mask layer is shown in FIG. 5A.

Figure 5B:
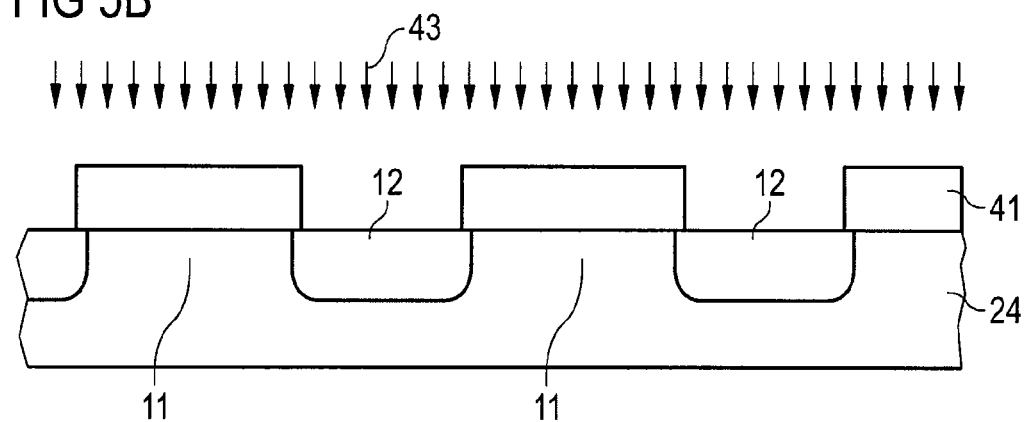

Dopants for forming second semiconductor zones 12 are subsequently introduced into the semiconductor substrate 24. This can be effected for example by implantation 43 with subsequent thermal treatment for activating the dopants and for annealing implantation damage. The photomask 40 can be removed before or after the implantation. The lateral extent of the mask 41 here determines the distance d1 between adjacent second semiconductor zones 12. The structure thus obtained is shown in FIG. 5B.

Figure 5C:
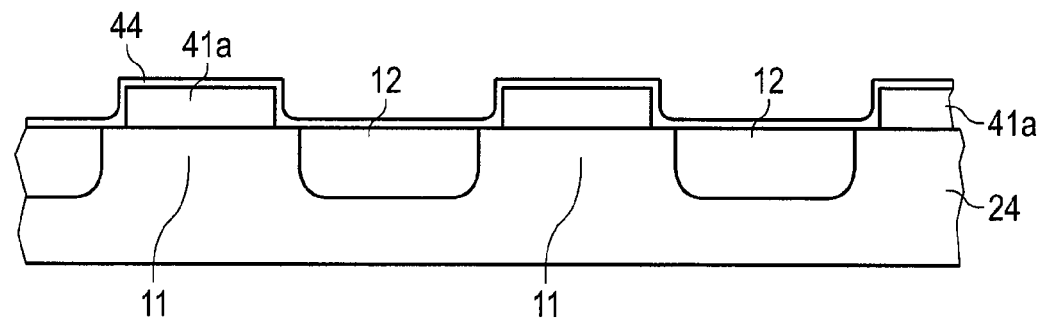

After the implantation, as shown in FIG. 5C, the mask 41 is etched back isotropically. This can be effected wet-chemically, for example. This gives rise to an etched-back mask 41a. As a result of the etching back, the outer edges of the etched-back mask 41a are now at a certain distance from the outer edges of the second semiconductor zones 12. As illustrated in FIG. 5C, a thin auxiliary layer 44 is deposited onto the etched-back mask 41a conformally from the same material as the etched-back mask 41a. This is silicon oxide in the present case. The thickness of the auxiliary layer 44 is chosen such that the vertical areas of the auxiliary layer 44 on the sidewalls of the mask are still spaced apart from the doping zones. This distance defines the distance d2 between the first Schottky contact that is to be formed later and the second semiconductor zone 12. By contrast, the width of the etched-back mask 41a together with the auxiliary layer 44 on the sidewalls thereof defines the width of the first Schottky contact.

Figure 5D:
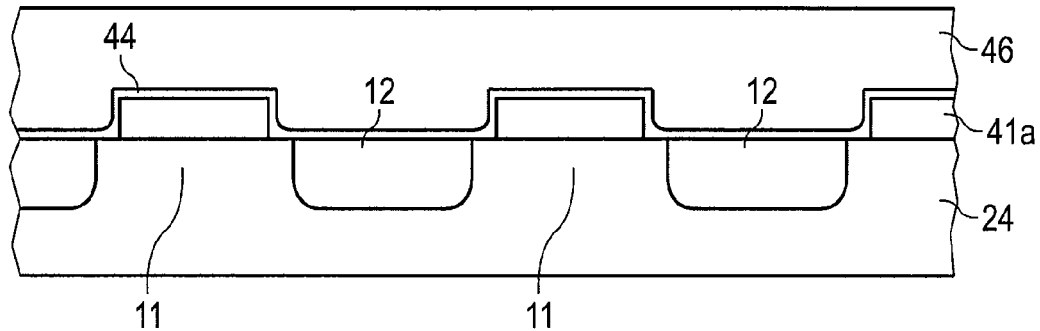

Afterward, as shown in FIG. 5D, a covering layer 46 composed of photoresist, for example, is deposited over the whole area with a thickness greater than the thickness of etched-back mask 41a and auxiliary layer 44. The covering layer 46 therefore completely covers the mask 41 and the auxiliary layer 44. Instead of the photoresist, it is also possible to use a different material for the covering layer 46, in which case care should be taken to ensure that the material of the etched-back mask 41a and of the auxiliary layer 44 can be etched selectively with respect to the material of the covering layer 46. Furthermore, the material of the covering layer 46 should be able to be removed again relatively easily since a sacrificial mask is subsequently formed from the covering layer 46.

Figure 5E:
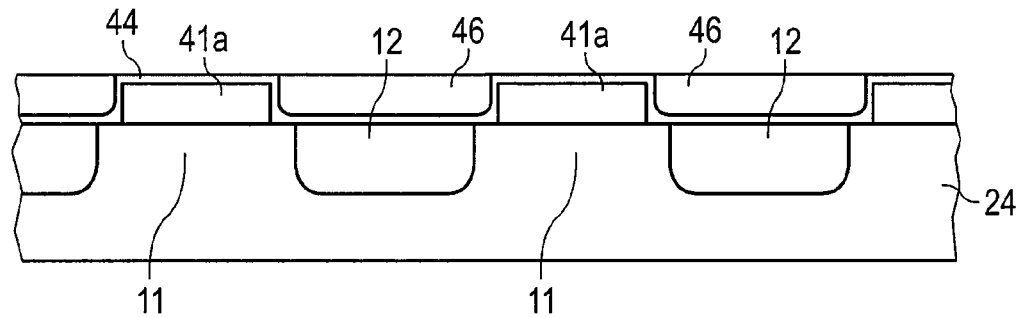

The covering layer 46 is subsequently etched back, for example by means of a dry etching step, until the auxiliary layer 44 on the etched-back mask 41a has been uncovered. The covering layer 46 remains, by contrast, laterally alongside the etched-back mask 41a. As an alternative, an ion beam exposure method can be used for etching back in the case of photoresist. This method makes use of the circumstance that a suitably chosen photoresist is modified and thereby "exposed" only by ions having an energy in a certain energy range. When penetrating through the photoresist layer, the ions lose energy and generate photoelectrons which expose the photoresist. The photoresist is therefore exposed only down to a certain depth. The exposure depth can be set by choosing the initial energy of the ions. Exposed regions can then be removed chemically. The structure obtained is shown in FIG. 5E.

Figure 5F:
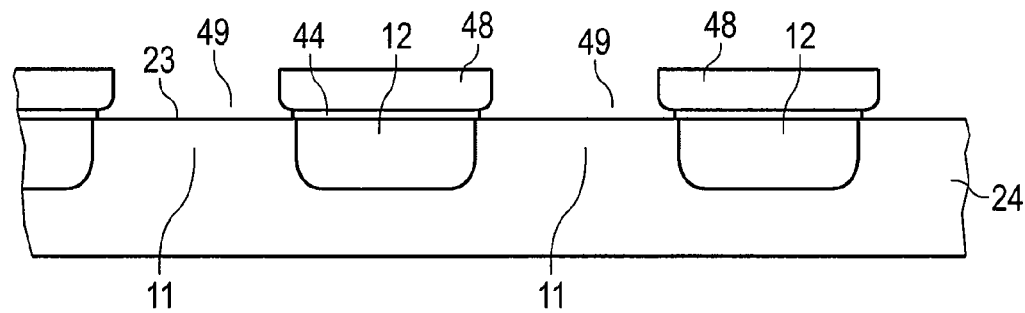

The etched-back mask 41a is subsequently removed by means of an isotropic etching step, for example a wet-chemical etch. At the same time, the auxiliary layer 44 on the etched-back mask 41a is removed and is partly undercut in the region of the covering layer 46 that has remained after the etching back. This results in a sacrificial mask 48 having openings 49 which define the extent of the first Schottky contact, as shown in FIG. 5F.

As shown in FIG. 5G, an electrically conductive first layer 50 for forming the first Schottky junction is then applied over the whole area. The first layer 50 forms only on horizontal areas. As shown in FIG. 5G, the first layer 50 is patterned by the sacrificial mask 48 in the openings 49 to form layer regions 50a lying directly on the uncovered surface of the first semiconductor zone 11. Since the sacrificial mask 48 projects laterally beyond the second semiconductor zones 12, the layer regions 50a are spaced apart laterally from the outer edges of the second semiconductor zones 12. The layer regions 50a cover a first surface region of the first semiconductor zone 11.

The sacrificial mask 48 and the residues of the auxiliary layer 44 that remained are subsequently removed. The layer regions of the first layer 50 that lie on the sacrificial mask 48 are simultaneously removed as a result. This corresponds to a lift-off technique. When a photoresist is used, the sacrificial mask 48 can be removed wet-chemically, for example. The auxiliary layer 44 can likewise be removed wet-chemically. The structure thus obtained is shown in FIG. 5H.

Finally, an electrically conductive second layer 52 is deposited over the whole area. The second layer 52 makes contact laterally alongside the layer regions 50a with the uncovered surface of the first semiconductor zone 11 (second surface region of the first semiconductor zone 11) and leads to the formation of the second Schottky contact there. The second layer 52 is furthermore in contact with the second semiconductor zone 12 and thus electrically conductively connects the layer regions 50a of the first layer to the second semiconductor zones 12.

The first and second layers 50, 52 are composed of different contact materials which together with the semiconductor material of the first semiconductor zone 11 form in each case a Schottky contact having barrier heights of different magnitude. The contact materials used and also the spatial extent of the first and second Schottky contacts are to be chosen such that a lowest possible reverse current flows in the blocking case. Suitable materials are metals, inter alia.

Suitable materials are aluminum, tantalum, tungsten, titanium and nickel, inter alia. These metals have an increasing barrier height in the direction of enumeration, wherein the barrier with respect to n-doped SiC is approximately 1.0 eV in the case of aluminum and tantalum, approximately 1.05 eV in the case of tungsten, approximately 1.27 eV in the case of titanium and approximately 1.4 eV in the case of nickel. Suitable combinations for metal 1 (layer 50)/metal 2 (layer 52) are accordingly for example titanium/aluminum or nickel/titanium.

Since the barrier height, as already described further above, depends not only on the difference in work functions but also on the quality of the interface between semiconductor material and contact material, it is recommendable to carry out suitable test series of discrete Schottky contacts formed between different contact materials and the semiconductor material, in order to determine the barrier height of the individual contact materials beforehand. As a result, the barrier height of each contact for the semiconductor material chosen can be experimentally determined separately taking account of specific process parameters.

It should be noted that not every contact between a metal and a semiconductor material leads to a Schottky contact. By way of example, the extent of the depletion zone in the semiconductor material depends greatly on the dopant concentration. Given correspondingly high doping, the depletion zone and thus the spatial extent of the Schottky barrier in the semiconductor material becomes so narrow that it can be disregarded and the junction between metal and semiconductor material behaves like an ohmic resistance.

Furthermore, by means of suitable alloying, for example by forming a metal silicide at the interface between metal and semiconductor material, the Schottky contact can be converted into an ohmic contact. This is effected for example during correspondingly long thermal treatment at correspondingly high temperatures.

In order to take account of the influences of process steps downstream of the production of the Schottky contacts, it is recommendable to take account of said process steps also in the test series for determining the Schottky barrier height.

As an alternative to the step shown in FIG. 5I, in which a second layer 52 for forming the second Schottky junction is deposited over the whole area, it is also possible to carry out a surface modification with subsequent deposition of a material layer 56 composed of the material of the first layer 50 and of the layer regions 50a. This alternative is shown in FIGS. 6A to 6C.

Figure 6A:
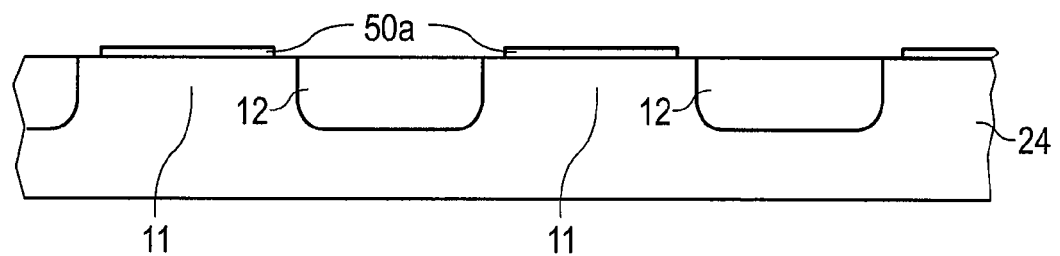
FIGS. 6A to 6C show method steps of a further production method for producing a semiconductor component having three rectifying junctions having barrier heights of different magnitude in each case.

The starting point is for example the structure obtained in FIG. 5H, this structure being reproduced in FIG. 6A. Consequently, the steps shown in FIGS. 5A to 5H can precede the method shown in FIGS. 6A to 6C. However, it is also possible to produce the layer regions 50a by means of other method steps, for example by means of etching.

Figure 6B:
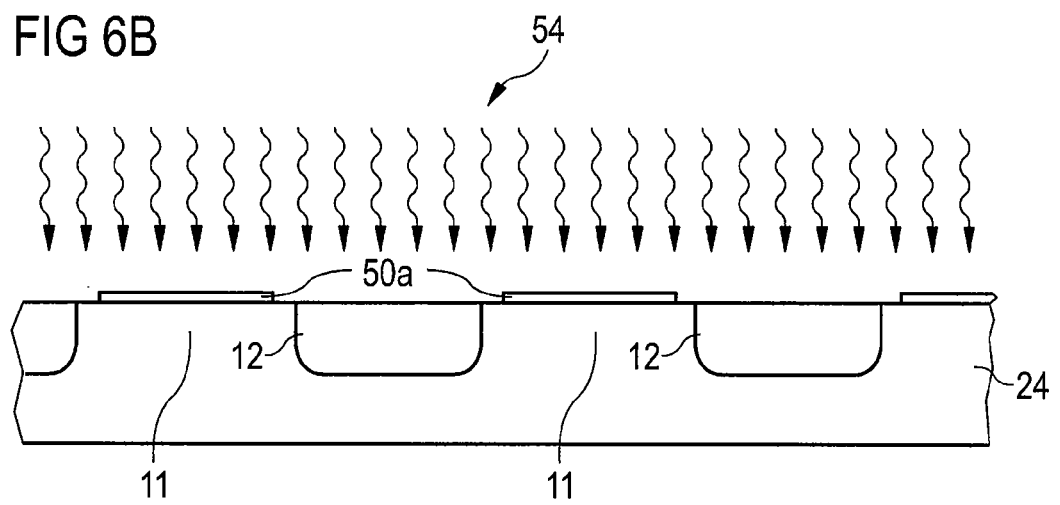
Figure 6C:
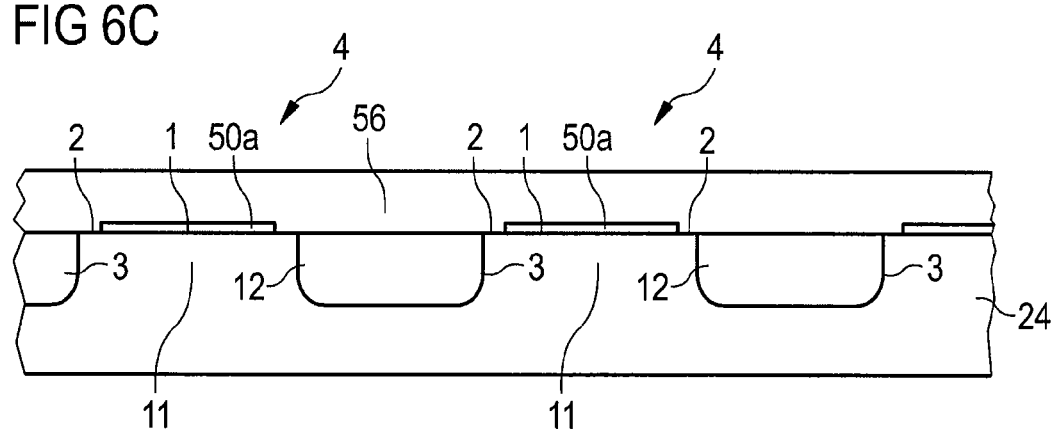

FIG. 6B shows a plasma treatment, which modifies that surface of the first semiconductor zone 11 which is not covered by the layer regions 50a of the first layer 50 and is therefore uncovered. The plasma treatment alters surface states, for example defects, which influence the barrier height.

Instead of the plasma treatment, it is also possible to carry out a superficial oxidation of the uncovered surface with subsequent wet-chemical removal of the thin oxide layer. Surface states are likewise modified as a result. This method implementation can for example also be carried out before depositing the layer regions 50a.

It goes without saying that a selective or common surface modification can also be carried out when using different contact materials in order to set the barrier heights in a suitable manner.

As described above, the first rectifying junction can be produced by a lift-off technique. Furthermore, as describes above, in some embodiments, in order to form the third rectifying junctions 3, a mask 41 is applied to the first surface 23 of the semiconductor body and dopants of the second conduction type are subsequently introduced into the semiconductor body. A sacrificial mask 48 having openings 49 can then be applied to the semiconductor body in self-aligned fashion with respect to the mask 41, 41a. The mask 41, 41a is removed and an electrically conductive first layer 50, 50a is applied in order to form the first rectifying junction 1. The sacrificial mask 48 is removed, so that layer regions 50a remain on the first surface 23 in the region of the openings 49 of the sacrificial mask 48. In further embodiments, prior to applying the sacrificial mask 48, the mask 41 can be etched back isotropically and a thin auxiliary layer 44 composed of the same material as the mask 41, 41a is applied conformally.

Furthermore, as described above, when employing surface modification, selected modification of the surface can be effected by plasma treatment or by oxidation of the surface of the respective surface region with subsequent removal of the oxide layer.

As described above, the same material or different material can be used for forming the first and second layers 50, 52. Both variants can be combined with a surface modification.

If an anisotropic semiconductor material is used, surfaces of different crystallographic orientation are formed, for example by etching. The respective surfaces can be modified as described above either together or selective. The respective Schottky junctions are then formed by depositing a Schottky forming material on the respective surfaces. It is possible to use the same material or different materials.

The method can also be described in more general terms, which method includes providing a semiconductor body; forming a pn junction in the semiconductor body; and forming a Schottky diode with respect to the semiconductor body, wherein the Schottky diode is formed in such a way that it has Schottky contacts having barrier heights of different magnitude.

The semiconductor component described is in particular a merged pn Schottky diode, typically for power applications. Furthermore, the semiconductor component can also be a body diode of a MOSFET between source and channel/substrate.

The embodiments described above typically have three rectifying junctions. However, it is possible to provide even further rectifying junctions having different barrier heights in each case. In particular more than two Schottky junctions lead to an even better performance of the semiconductor component.

The written description above uses specific embodiments to disclose the invention, including the best mode, and also to enable any person skilled in the art to make and use the invention. While the invention has been described in terms of various specific embodiments, those skilled in the art will recognize that the invention can be practiced with modification within the spirit and scope of the claims. Especially, mutually non-exclusive features of the embodiments described above may be combined with each other. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A semiconductor component, comprising:
a semiconductor body comprising a first semiconductor zone of a first conduction type;
at least one first rectifying junction with respect to the first semiconductor zone;
at least one second rectifying junction with respect to the first semiconductor zone, wherein the first rectifying junction and the second rectifying junction are formed on a planar first surface of the semiconductor body; and
at least one third rectifying junction with respect to the first semiconductor zone,
wherein the three rectifying junctions each comprise a barrier height of different magnitude, the second rectifying junction comprising a lower barrier height than the first rectifying junction, the first rectifying junction comprising a lower barrier height than the third rectifying junction, the second rectifying junction being arranged between the first and third rectifying junctions, wherein the third rectifying junction directly adjoins the second rectifying junction.

2. The semiconductor component as claimed in claim 1, wherein the three rectifying junctions are connected in parallel with one another.

3. The semiconductor component as claimed in claim 1, wherein the third rectifying junction is a pn junction.

4. The semiconductor component as claimed in claim 1, wherein the first and second rectifying junctions are in each case a Schottky contact.

5. The semiconductor component as claimed in claim 1, wherein the first rectifying junction comprises a larger contact area with respect to the first semiconductor zone than the second rectifying junction.

6. The semiconductor component as claimed in claim 1, further comprising:
at least two second rectifying junctions; and
at least two third rectifying junctions, wherein a respective second rectifying junction is arranged between the first rectifying junction and a respective adjacent third rectifying junction.

7. The semiconductor component as claimed in claim 6, wherein the first rectifying junction is at substantially the same distance from each adjacent third rectifying junction.

8. The semiconductor component as claimed in claim 6, wherein the two second rectifying junctions each comprises substantially the same lateral, extent.

9. The semiconductor component as claimed in claim 1, wherein
the first rectifying junction is formed by an electrically conductive first layer in contact with the first semiconductor zone, and
the second rectifying junction is formed by an electrically conductive second layer in contact with the first semiconductor zone.

10. The semiconductor component as claimed in claim 9, wherein the first and second layers are composed of different materials.

11. The semiconductor component as claimed in claim 9, wherein a contact area of the first semiconductor zone that is in contact with the first and second layers is modified at least in the region of one of the two layers.

12. A semiconductor component, comprising:
a semiconductor body comprising:
at least one first semiconductor zone of a first conduction type; and
at least one second semiconductor zone of a second conduction type, which is complementary to the first conduction type, said at least one second semiconductor zone being arranged in the semiconductor body and forming a pn junction with respect to the first semiconductor zone; and
at least one Schottky diode with respect to the first semiconductor zone, the Schottky diode comprising at least two Schottky contacts comprising barrier heights of different magnitude, the Schottky contacts of the Schottky diode being arranged such that the first Schottky contact comprises a higher barrier height in comparison with the second Schottky contact and is arranged in the region of high field strengths, and the second Schottky contact is arranged in the region of lower field strengths, wherein the magnitude of the field strength relates to the blocking case of pn junction and Schottky diode, the first Schottky contact and the second Schottky contact are formed on a planar first surface of the semiconductor body, and the pn junction directly adjoins the second Schottky contact.

13. The semiconductor component as claimed in claim 12, wherein the Schottky contacts of the Schottky diode are formed by layers composed of identical materials.

14. The semiconductor component as claimed in claim 12, wherein a contact area of the first semiconductor zone with respect to one of the layers is modified in the region of one of the two Schottky contacts.

15. A method for producing a semiconductor component, comprising:
providing a semiconductor body comprising a first semiconductor zone of a first conduction type;
forming at least one first rectifying junction with respect to the first semiconductor zone;
forming at least one second rectifying junction with respect to the first semiconductor zone, wherein the first rectifying junction and the second rectifying junction are formed on a planar first surface of the semiconductor body; and
forming at least one third rectifying junction with respect to the first semiconductor zone,
wherein the three rectifying junctions comprise a barrier height of different magnitude in each case, the rectifying junction being formed such that the second rectifying junction comprises a lower barrier height than the first rectifying junction, the first rectifying junction comprises a lower barrier height than the third rectifying junction, and the second rectifying junction is arranged between the first and third rectifying junctions, wherein the third rectifying junction directly adjoins the second rectifying junction.

16. The method as claimed in claim 15, further comprising forming a second semiconductor zone of a second conduction type, which is complementary to the first conduction type, in order to form the third rectifying junction in the semiconductor body, such that the second semiconductor zone is in contact with the first semiconductor zone.

17. The method as claimed in claim 15, further comprising applying a first layer to a first surface region of the first semiconductor zone in order to form the first rectifying junction.

18. The method as claimed in one of claims 15, further comprising applying a second layer to a second surface region of the first semiconductor zone in order to form the second rectifying junction.

19. The method as claimed in claim 18, wherein different materials are used for forming the first and second layers.

20. The method as claimed in claim 18, further comprising modifying at least one of the first surface region, second surface region and both surface regions of the first semiconductor zone prior to applying the first and/or the second layer.

21. The method as claimed in claim 15, further comprising forming at least two third rectifying junctions with respect to the first semiconductor zone, wherein the two third rectifying junctions are spaced apart from one another, and the first rectifying junction is formed in self-aligned fashion between the two third rectifying junctions.

\* \* \* \* \*